(12) United States Patent
Pant et al.

(10) Patent No.: US 7,928,716 B2
(45) Date of Patent: Apr. 19, 2011

(54) POWER SUPPLY MODULATION

(75) Inventors: Pankaj Pant, Westborough, MA (US); Don Douglas Josephson, Fort Collins, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/346,475

(22) Filed: Dec. 30, 2008

(65) Prior Publication Data
US 2010/0164472 A1 Jul. 1, 2010

(51) Int. Cl.
*G05F 3/04* (2006.01)
(52) U.S. Cl. .......................................................... 323/312
(58) Field of Classification Search ................ 363/5, 16, 363/17, 20, 50, 71; 323/264, 283, 311, 312, 323/317, 350, 351; 324/612; 307/443; 371/21.1; 702/117
See application file for complete search history.

(56) References Cited

U.S. PATENT DOCUMENTS

| | | | | |
|---|---|---|---|---|
| 5,254,883 A | * | 10/1993 | Horowitz et al. | 326/30 |
| 5,717,321 A | * | 2/1998 | Kerth et al. | 323/283 |
| 5,844,913 A | * | 12/1998 | Hassoun et al. | 714/718 |
| 6,072,740 A | * | 6/2000 | Borkar | 365/206 |
| 6,173,425 B1 | * | 1/2001 | Knaack et al. | 714/718 |
| 6,343,022 B1 | * | 1/2002 | Naruse | 363/16 |
| 6,737,857 B2 | * | 5/2004 | Babcock | 324/158.1 |
| 7,036,062 B2 | * | 4/2006 | Morris et al. | 714/733 |
| 7,239,494 B2 | | 7/2007 | Naffziger | |
| 7,321,482 B2 | * | 1/2008 | Josephson et al. | 361/56 |
| 7,334,168 B2 | * | 2/2008 | Kai et al. | 714/700 |

* cited by examiner

*Primary Examiner* — Adolf Berhane
*Assistant Examiner* — Yemane Mehari
(74) *Attorney, Agent, or Firm* — Schwabe, Williamson & Wyatt, P.C.

(57) ABSTRACT

Embodiments of methods and apparatus for modulating a power source are disclosed. In some embodiments, a method may comprise predicting, by a current control logic, a potential voltage transient on a power supply bus, and modulating, by the current control logic, a current source, based at least in part on said predicting, to control the predicted voltage transient. Additional variants and embodiments may also be disclosed and claimed.

19 Claims, 6 Drawing Sheets

POWER SUPPLY MODULATION

TECHNICAL FIELD

Embodiments of the disclosure relate generally to fields of integrated circuits and electronic systems, and more particularly, to modulating power supply in integrated circuits and electronic systems.

BACKGROUND

The extraordinary level of integration in the current generation of integrated circuits now allows a single integrated circuit chip to perform the functions that would have taken multiple separate chips in the past. Oftentimes, an increase in the level of integration may pose one or more associated problems. For example, because of a high level of integration in an integrated circuit, voltage transients may occur due to an increase in local power density. Such voltage transients may cause errors during an operation or testing of a circuit if the transients are severe enough, and it may be desirable to substantially eliminate or reduce such voltage transients. Also, reproduction of such voltage transients may be desired during testing and/or debugging of a circuit to stress the operation of the circuit.

BRIEF DESCRIPTION OF THE DRAWINGS

Various embodiments will be described referencing the accompanying drawings in which like references denote similar elements, and in which.

DETAILED DESCRIPTION OF ILLUSTRATIVE EMBODIMENTS

Illustrative embodiments include, but are not limited to, methods and apparatus for modulating power supply.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the disclosure. This application is intended to cover any adaptations or variations of the embodiments discussed herein. Therefore, it is manifestly intended that the embodiments of the disclosure be limited only by the claims and the equivalents thereof.

Figure 1:
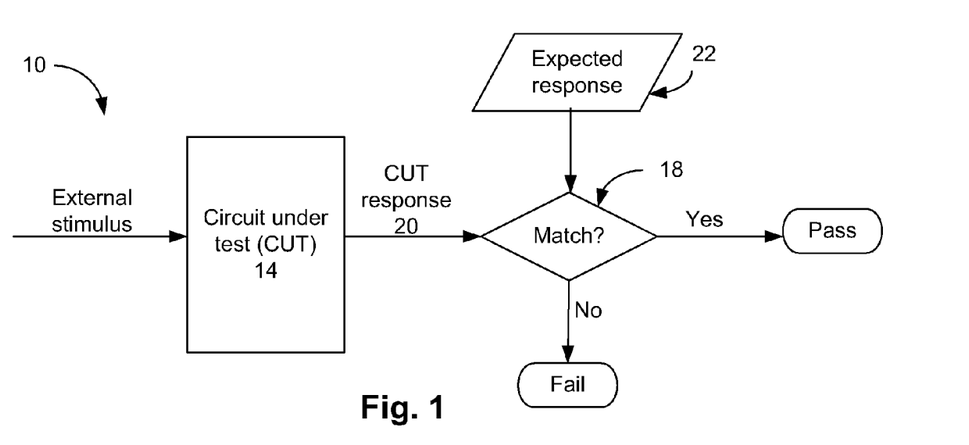
FIG. 1 illustrates an exemplary block diagram of a system for testing a circuit under test (CUT)

FIG. 1 illustrates an exemplary block diagram of a system 10 for testing a circuit under test (CUT) 14. In various embodiments, in the system 10, an external stimulus may be applied to the CUT 14, and a response 20 of the CUT 14 may be compared, at 18, with an expected response 22 to determine whether the response 20 and the expected response 22 match. If all tested components of the CUT 14 are operating as desired, the expected response 22 may match response 20 of the CUT 14, in which case the CUT 14 has passed the testing. Otherwise, it may be deduced that the CUT 14 has failed the test, or at the least, additional testing is necessary.

As previously discussed, transients in a power supply (e.g., a droop in the power supply voltage) in a circuit may lead to erroneous operation of the circuit. In various embodiments, power supply voltage fluctuation (e.g., voltage droop) may be a very transient phenomenon and the extent and duration of the voltage excursion may depend on a complex interaction between a number of different variables, and it may sometimes be difficult to isolate the cause of the voltage change. Moreover, power supply transients may be dependent on a computing platform (e.g., a functional system or a manufacturing tester) used to exercise the circuit and/or on a type of test being applied to the circuit, making it difficult to replicate the voltage transients under controlled conditions in one or more environments.

Figure 2:
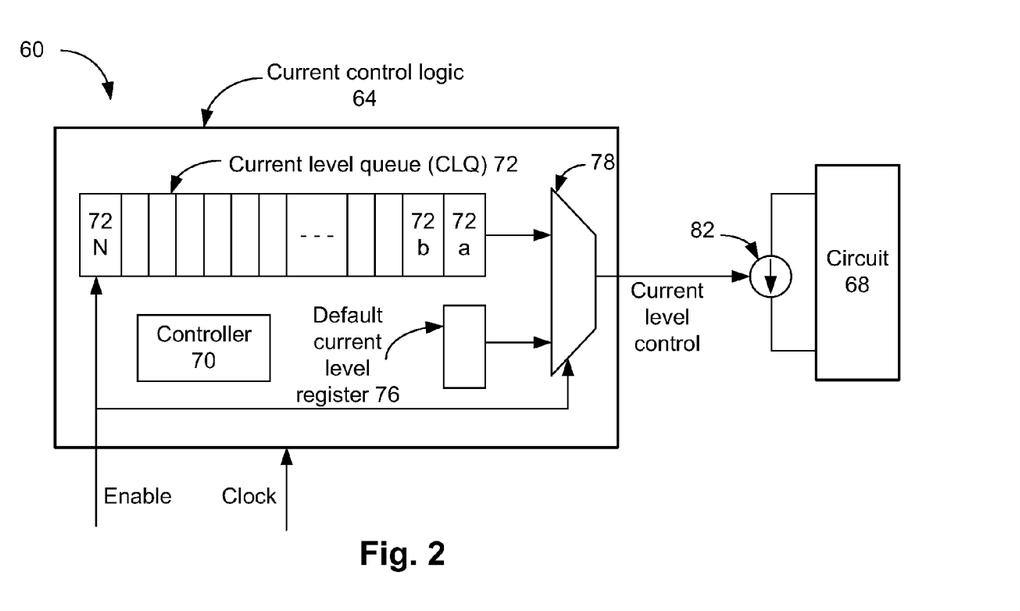
FIG. 2 illustrates an exemplary block diagram of system including a current control logic coupled to a current source, in accordance with various embodiments.

FIG. 2 illustrates an exemplary block diagram of system 60 including a current control logic 64 coupled to a current source 82, in accordance with various embodiments. In various embodiments, the current control logic 64 may be configured to modulate the current of the controllable current source 82. In various embodiments, the current source 82 may be coupled to a circuit 68 and configured to supply current to one or more elements of the circuit 68. In various embodiments, the circuit 68 may be an integrated circuit. Although the current control logic 64 and the current source 82 are illustrated in FIG. 2 to be external to the circuit 68, in various embodiments, the current control logic 64 and/or the current source 82 may be included inside the integrated circuit 68.

In various embodiments, the current control logic 64 may include a current level queue (CLQ) 72. The CLQ 72 may include a plurality of queue entries 72a, 72b, . . . , 72N. The current control logic 64 may also include a multiplexer 78 and a default current level register 76. One or more operations of the current control logic 64 may be controlled by a controller 70. A clock signal may also be input to the current control logic 64.

The multiplexer 78 may be controlled by an enable signal, which may also be configured to enable the CLQ 72. In various embodiments, based at least in part on the status of the enable signal, the multiplexer 78 may be configured to selectively output either the entries of one or more queue entries 72a, . . . , 72N or an output from the default current level register 76. For example, in various embodiments, when the enable signal is asserted, the multiplexer 78 may sequentially output one or more entries of the CLQ 72; and when the enable signal is not asserted, the multiplexer 78 may output a value stored in the default current level register 76. The output of the multiplexer 78 may be a current level control signal, which may be configured to control or modulate a current drawn by the current source 82.

In various embodiments, when the enable signal is asserted, each of the plurality of queue entries 72a, 72b, . . . , 72N may be configured to control the current source 82 for a respective duration of time, wherein the duration of time may be programmable. For example, in various embodiments, each queue entry may control the current source 82 for one clock cycle (or two clock cycles, or any other number of clock cycles, based, for example, on the design and the extent to which it may be desired to control the current source 82). Although not illustrated in FIG. 2, there may be a programmable means (possibly through the controller 70 and/or an input device) by which a user or a system may program and/or modify the queue entries 72a, . . . , 72N and/or the default current level register 76.

Thus, when enabled, the CLQ 72 may output its queue entries 72a, . . . , 72N sequentially to the multiplexer 78. For example, when the CLQ 72 is enabled, the CLQ 72 may output the queue entry 72a for a first duration of time (e.g., a first clock cycle), which may be utilized to control the current source 82 for the first duration of time. Similarly, for a second duration of time (e.g., a second clock cycle) occurring subsequent to the first duration of time, the CLQ 72 may output the queue entry 72b, which may be utilized to control the current source 82 for the second duration of time; and so on, and for an $N^{th}$ duration of time, the queue entry 72N may be utilized to control the current source 82. In various embodiments, the CLQ 72 may be configured to repeat, i.e., to loop back upon itself, such that, for example, for $(N+1)^{th}$, $(N+2)^{th}$, . . . , $2N^{th}$ duration of times, queue entries 72a, 72b, . . . , 72N, respectively, may again be utilized to control the current source 82.

In various embodiments, when the enable signal is de-asserted, the CLQ 72 may be disabled, and the default current level register 76 may be configured to control the current source 82A. That is, when the CLQ 72 is disabled by de-asserting the enable signal, the multiplexer 78 may be configured to output a value stored in the default current level register 76, which may be used to control the current source 82.

In various embodiments, the current control logic 64 and the current source 82 may be configured to create and/or control (e.g., increase or reduce) a voltage transient during an operation and/or testing of the circuit 68, as discussed more fully herein.

Figure 3:
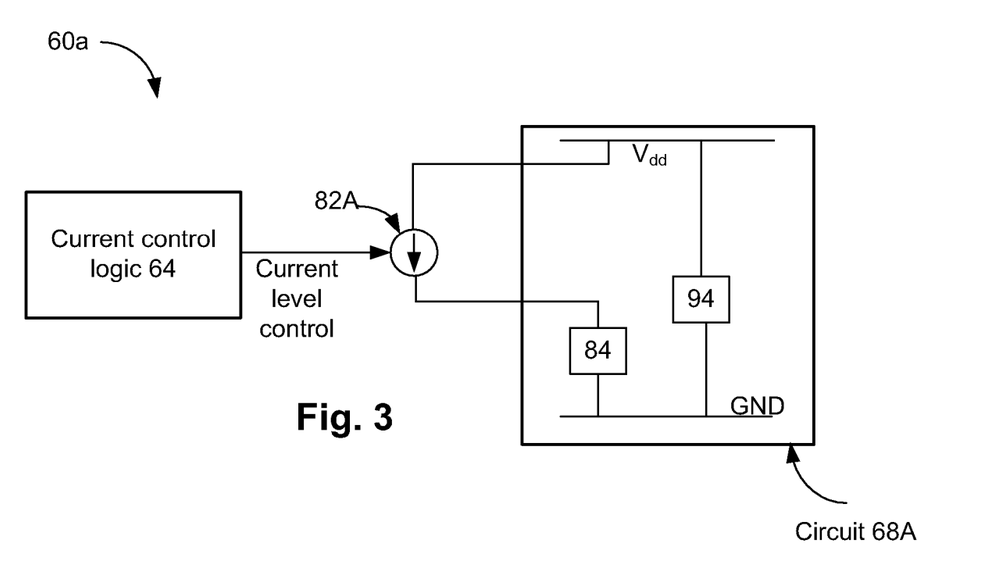
FIG. 3 illustrates another exemplary block diagram of system including a current control logic coupled to a current source, in accordance with various embodiments.

FIG. 3 illustrates an exemplary block diagram of system 60a including a current control logic 64 coupled to a current source 82A, in accordance with various embodiments. In various embodiments, the current control logic 64 and the current source 82A of FIG. 3 may be substantially similar to the current control logic 64 and current source 82, respectively, of FIG. 2. Although not illustrated in FIG. 3, in various embodiments, the current control logic 64 (or one or more of its components) and/or the current source 82A may be incorporated within (i.e., integrated in) the circuit 68B.

Referring again to FIG. 3, in various embodiments, the current source 82A may be coupled to a power supply bus Vdd and also coupled to a ground bus GND through a load 84 inside a circuit 68A. A second load 94 may also be coupled between the Vdd and GND bus. The loads 84 and 94 may be of any appropriate type, and may include one or more components of the circuit 68A. For example, in various embodiments, the load 94 may encompass one or more components of circuit 68A that are coupled between the Vdd and the GND buses. As would be readily appreciated by those skilled in the art, current source 82A, along with the load 84, forms a shunt connection to the load 94 (i.e., parallel to the load 94).

Variations of system 60a may easily be envisioned by those skilled in the art. For example, in various embodiments, the load 84 may be absent, and the current source 82A may be directly coupled between the Vdd and GND bus. In other embodiments, the load 84 may be coupled between the Vdd bus and the current source 84.

Figure 4:
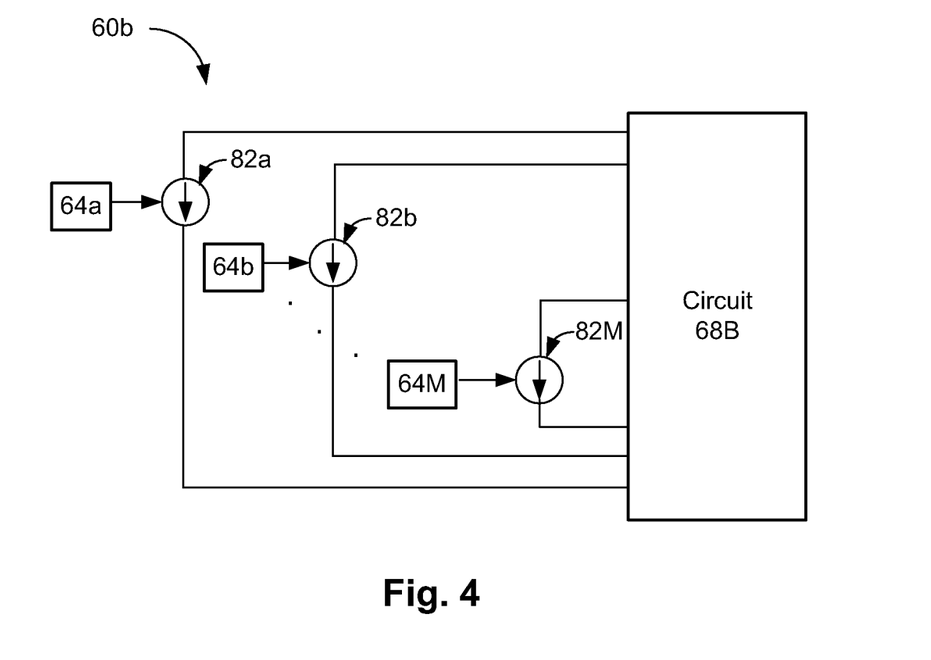
FIG. 4 illustrates an exemplary block diagram of system including a plurality of current control logic elements, each coupled to a respective current source, in accordance with various embodiments.

FIG. 4 illustrates an exemplary block diagram of system 60b including a plurality of current control logics 64a, 64b, . . . , 64M, coupled to respective current sources 82a, 82b, . . . , 82M, in accordance with various embodiments. Each of the current sources 82a, 82b, . . . , 82M, may be coupled to one or more components of a circuit 68B. Although not illustrated in FIG. 4, in various embodiments, one or more current control logics 64a, 64b, . . . , 64M and/or one or more current sources 82a, 82b, . . . , 82M may be incorporated within (i.e., integrated in) the circuit 68B. In various embodiments, it may also be possible for a single one of current control logics 64a, 64b, . . . , 64M to be coupled to more than one of current sources 82a, 82b, . . . , 82M.

In various embodiments, although not illustrated in FIG. 4, one or more of the current sources 82a, 82b, . . . , 82M may be coupled to one or more power supply buses (similar to the power supply bus Vdd of FIG. 3) inside circuit 68B. For example, in various embodiments, all the current sources 82a, 82b, . . . , 82M may be coupled to a single power supply bus Vdd. Alternatively, in other embodiments, each of the current sources 82a, 82b, ..., 82M may be coupled to a respective power supply bus inside the circuit 68B. Other combinations may also be envisioned by those skilled in the art (e.g., current sources 82a and 82b coupled to the same power bus, while each of the other current sources coupled to a respective power bus).

In various embodiments, it may also be possible to combine multiple CLQs in one current control logic, with each queue configured to control a respective current source. For example, although not illustrated in FIG. 4, in various embodiments, M different CLQs in one current control logic may be configured to control the current sources 82a, ..., 82M, with each CLQ controlling a respective current source. In various embodiments, it may also possible for a single CLQ to control more than one current source.

Figure 5:
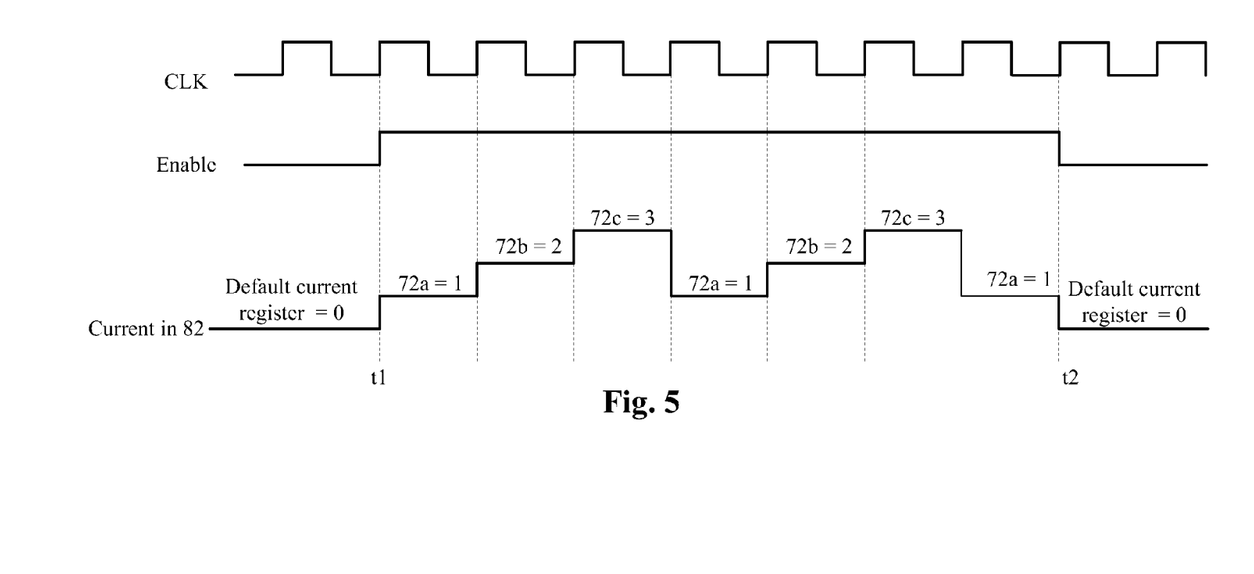
FIG. 5 illustrates an exemplary timing diagram of the current in the current source of FIG. 2, in accordance with various embodiments.

FIG. 5 illustrates an exemplary timing diagram of a current in the current source 82 of FIG. 2, in accordance with various embodiments. For the embodiments of FIG. 5, for exemplary purposes only, the CLQ 72 of FIG. 2 may have three queue entries, with 72a=1, 72b=2, and 72c=3, and the default current register may have a value of 0. Referring again to FIG. 5, in various embodiments, at time t1, the enable signal may be asserted (to coincide with, for example, a rising edge of a clock signal). Before time t1, the current drawn from the current source 82 may be substantially equal to the value of the default current register, i.e., 0. From t1, once the enable signal is asserted, the current drawn from the current source 82 for the next clock cycle may substantially be equal to the queue entry 72a, i.e., 1. During the second clock cycle after time t1, the current drawn from the current source 82 may substantially be equal to the queue entry 72b, i.e., 2. Similarly, during the third clock cycle after t1, the current drawn from the current source 82 may be substantially equal to the queue entry 72c, i.e., 3.

As previously discussed and as illustrated in FIG. 5, in various embodiments, the CLQ queue entries may repeat, i.e., loop back after the last queue entry modulates the current source 82. Thus, during the fourth clock cycle after t1, queue entry 72a may again control the current drawn by the current source 82. The process may continue until the enable signal is de-asserted at, for example, time t2, after which the current drawn by the current source 82 may again be substantially equal to the default current register value 0.

In various other embodiments, the current in current source 82 may be allowed to return to the default current register value (i.e., 0) for one or more clock cycles between the loop back (i.e., between the repetition). For example, the current in the current source 82 may be repeated as 0, 1, 2, 3, 0, 1, 2, 3, 0 ... and so on.

As would be readily apparent to those skilled in the art, the number and entries of the queue entries of FIG. 5 are purely exemplary in nature. With appropriate number and values of the queue entries, any other arbitrary current waveform may be created in the current source 82. Moreover, the duration of time (e.g., one clock cycle) for which a queue entry may control the current source 82 is also exemplary in nature. Furthermore, although it is assumed that the current drawn by the current source is substantially equal to the queue entries and/or the default register value, in various embodiments, the current may be equal to k*A, wherein k is a programmable value and A is a queue entry value or the default register value. That is, in various embodiments, the current drawn by the current source 82 may be substantially proportional (or equal) to the queue entries and/or the default register value.

In various other embodiments, the programmable value k may be modified based at least in part on a feedback received from a voltage transient detection mechanism (not illustrated in the figures) configured to detect the voltage value on the Vdd bus. For example, in various embodiments, a high bandwidth voltage detector may be used to control the current source 82A based on the nature of the voltage transient, which may allow an analog nature of the voltage transient to affect the current source, thereby controlling in part the voltage transient using the transient itself. In various other embodiments, the programmable value k may also be nonlinear.

As illustrated in FIG. 1, in a testing environment, a CUT may be tested by applying an external stimulus to the CUT. Various types of testing methodology may exist to test a CUT. For example, during scan-based at-speed testing, a stimulus may be applied to a CUT at or close to a rated speed of the circuit, and the clock signals may be applied to the CUT for a short burst, during which scan vectors may be uploaded to the CUT. In various embodiments, because of the sudden application of the clock signals during an at-speed scan test, one or more components may suddenly start drawing current from one or more power supply buses inside the CUT for a short period of time. As a result, one or more power supply buses may experience significant voltage transient or voltage droop, which may sometimes result in erroneous test results. There may also be voltage transients during other types of test (e.g., functional testing) or during regular operation of a circuit. Other instances of a voltage transient or a power supply droop may also be envisioned by those skilled in the art, and in various embodiments, some of the inventive principles of this disclosure may be applied to these instances as well. In various embodiments, it may be desired to control (e.g., create, increase, reduce, or eliminate) a voltage transient in a circuit.

Additionally, in various embodiments, it may be desired to control a voltage transient or a power supply droop by creating, or increasing the transient. For example, during a scan-based test, the number of clocks applied to a CUT may be very few (e.g., two clocks), or the clock frequency may be very high. Accordingly, the voltage transient or the droop in power supply may be relatively small, as the power grid may be fully charged before the clocks are applied and there may not be substantial droop during the short clock burst. In these cases, it may be desired to increase the voltage transient to substantially match a typical voltage transient seen during other types of testing (e.g., functional test or scan-based at-speed test that lasts for a longer duration) and/or during a regular operation of a circuit. Other instances may also be envisioned where it may be desired to create, or increase a voltage transient or a power supply droop.

Figure 6:
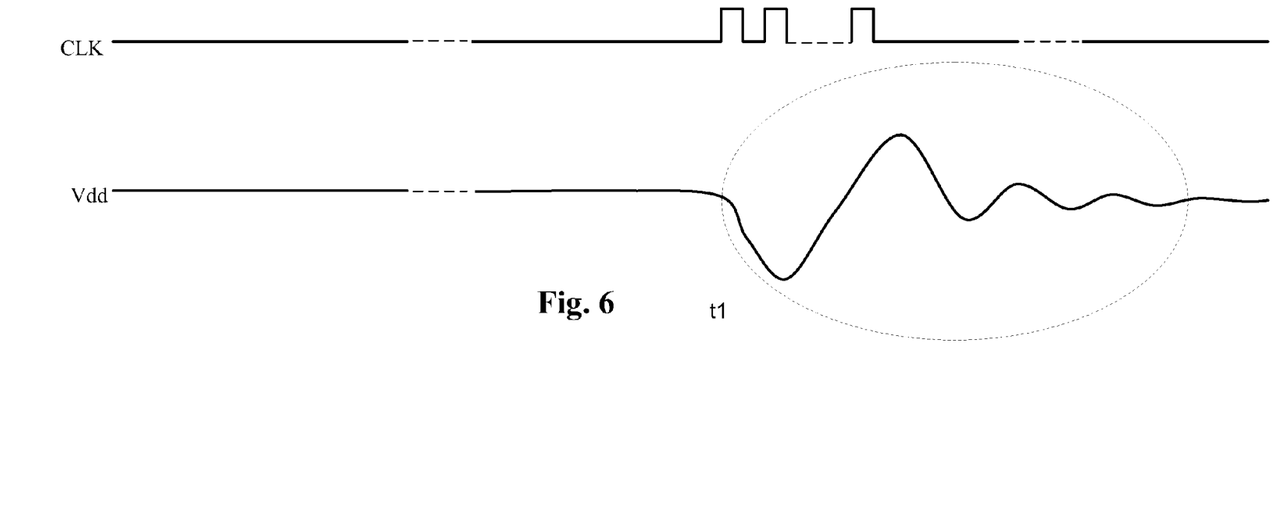
FIG. 6 illustrates an exemplary timing diagram of a voltage transient created in a power supply bus, during a testing operation, inside a circuit, in accordance with various embodiments.

FIG. 6 illustrates an exemplary timing diagram of a voltage transient created in a power supply bus, during a testing operation, inside a circuit (e.g., the circuit 68A of FIG. 3), in accordance with various embodiments. Referring to FIGS. 3 and 6, prior to time t1, scan vectors may be loaded in a testing device, and at time t1, the scan vectors may be applied to the circuit 68A of FIG. 3. As would be readily appreciated by those skilled in the art, during scan-based at-speed testing, the clock signals are applied for a short duration of time, using a short clock burst. Accordingly, at time t1, the clock signal may be applied to one or more components (e.g., load 94) in the circuit 68A. As a result, one or more components in the circuit 68A (e.g., load 94) may suddenly start drawing current from the power supply bus Vdd, and hence, there may be a considerable voltage transient or voltage droop in the power supply bus Vdd, illustrated by the solid line inside the dotted ellipse in FIG. 6. The voltage transient may also appear due to the sudden application of the clock signal, which may also draw power from the power supply bus Vdd. In various embodiments, the voltage transient may create erroneous testing results.

In various embodiments, the circuit 68A (or one or more components inside circuit 68A, e.g., a controller within the circuit 68A) and/or the current control logic 64 (or the controller 70 inside the current control logic 64) may anticipate the voltage transient in advance (i.e., prior to time t1), as the circuit 68A and/or the current control logic 64 may be aware of the impending testing.

In various embodiments, such transients may also occur during an operational phase of the circuit 68A, and the circuit 68A and/or the current control logic 64 may also anticipate the voltage transient in advance. For example, the circuit 68A may be aware of an impending floating point calculation that one or more of its components is going to perform, and may also be aware of a substantial increase in current drawn by the one or more components during the floating point calculation, potentially resulting in a droop in the voltage of a power supply bus that supplies current to the one or more components.

In various embodiments, it may be desired to create or control (e.g., increase, reduce, eliminate and/or modulate) such voltage transient or droop in the power supply.

Figures 7, 8:
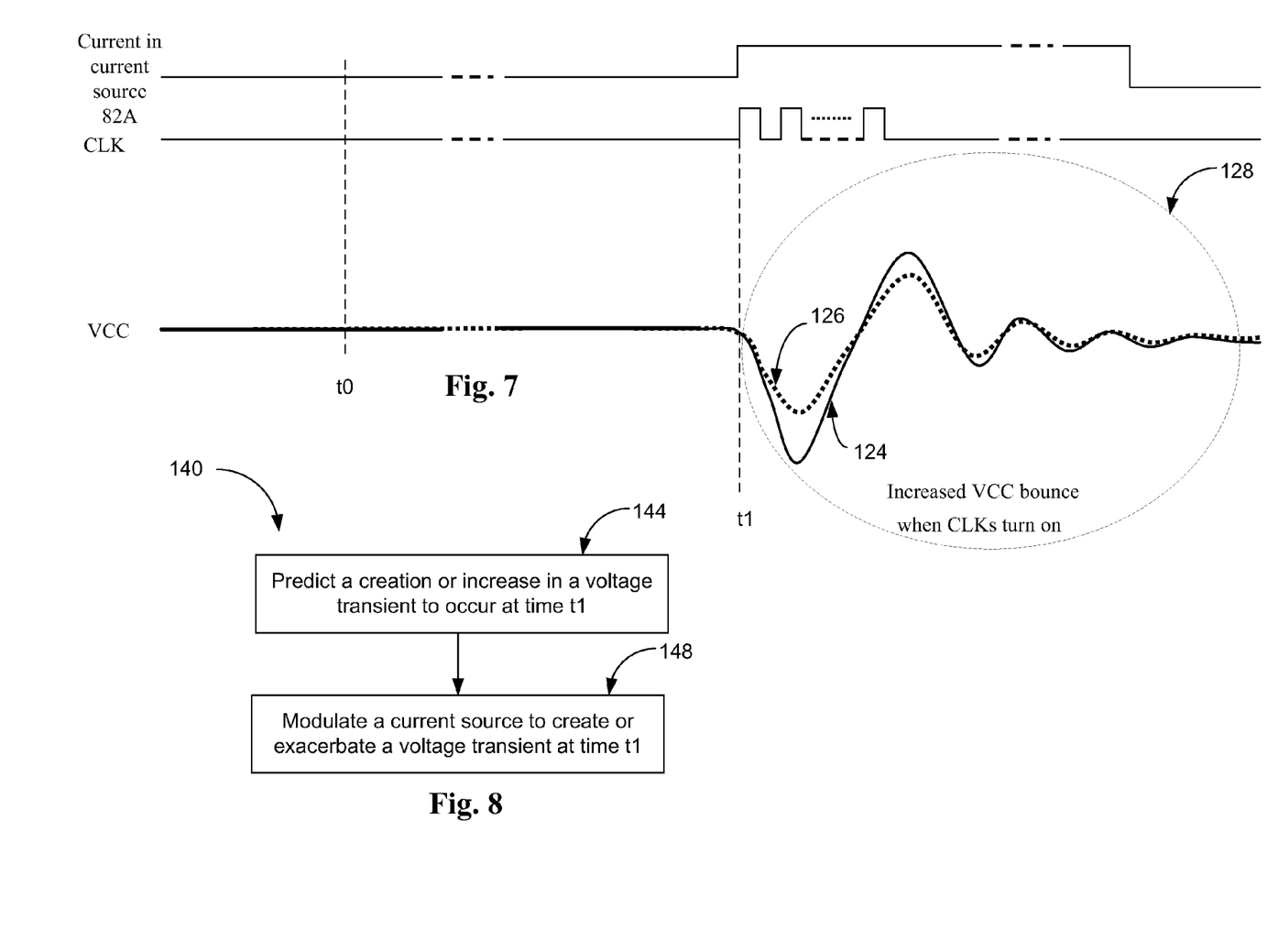
FIG. 7 illustrates an exemplary timing diagram of a method for creating or increasing a voltage transient in a power supply bus, in accordance with various embodiments.
FIG. 8 illustrates an exemplary method for creating or increasing a voltage transient in a power supply bus, in accordance with various embodiments.

FIG. 7 illustrates an exemplary timing diagram of a method for creating or increasing a voltage transient in a power supply bus (e.g., power supply bus Vdd inside circuit 68A of FIG. 3), in accordance with various embodiments; and FIG. 8 illustrates an exemplary method 140 for creating or increasing a voltage transient in the power supply bus, in accordance with various embodiments.

Referring to FIGS. 3, 7 and 8, the method 140 may include, at 144, predicting a creation or increase in a voltage transient to occur at time t1. In various embodiments, the prediction may be done at a time (e.g., time t0) that is prior to time t1. For example, during a scan-based test, t1 may be the time at which the clock signal bursts are to be applied to a circuit under test 68A, and as previously discussed in more detail with respect to FIG. 6, a voltage transient may be created at time t1. In various embodiments, it may be desired, at time t0, to further increase the voltage transient at time t1. In various other embodiments, it may be desired, at time t0, to create a voltage transient at time t1.

In various embodiments, the method 140 may further include, at 148, modulating the current source 82A to increase the voltage transient at time t1. For example, the current control logic 64 may be programmed such that from t1, there may be a rapid increase in the current drawn from the current source 82A. The current control logic 64 may be easily configured to achieve this by, for example, programming a default value of 0 (or any other low value) in the default current level register 76 (see FIG. 2), a value of 1 (or higher or any other appropriate nonzero value) in all the current queue entries 72a, . . . , 72N, and enabling the CLQ 72 at time t1.

As the current source 82A may be coupled to the power supply bus Vdd, the sudden increase in the current drawn from current source 82A at t1 may further increase the voltage transient caused by the application of the clock signals at time t1. That is, the effect of the increase in the current drawn by the current source 82A may add up with the effect of the increase in current drawn by load 94 in response to the application of the clock signals at time t1. The dotted line 126 in FIG. 7 represents the voltage transient that would have been caused due to the application of the clock signals at t1 (i.e., due to the current drawn by load 94), without the increase in current drawn by the current source 82A. The solid line 124 represents the increased voltage transient due to the increase in current drawn by the current source 82A, along with the effect of the application of clock signals from time t1. Thus, the difference between the lines 124 and 126 illustrates the increase in the voltage transient or the power supply droop caused by the current control logic 64 increasing the current drawn by the current source 82A from time t1.

In various embodiments, instead of a single current source, a number of current sources (e.g., similar to FIG. 4), each coupled to the power supply bus Vdd, may be used to create a larger (or more customizable) voltage transient. In various embodiments, calibration of the number of current sources and the amount of current drawn may be used to create a desired voltage transient profile.

Figure 9:
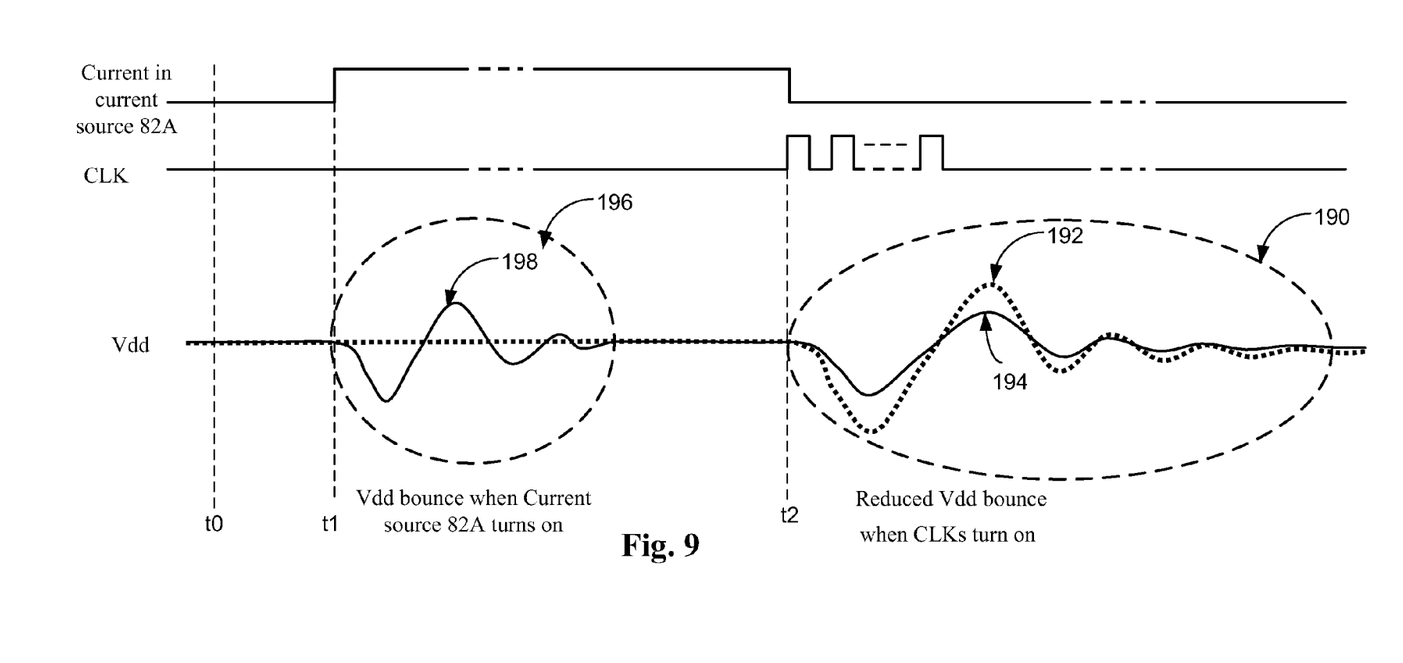
FIG. 9 illustrates an exemplary timing diagram of a method for mitigating or reducing a voltage transient created in a power supply bus, in accordance with various embodiments.
Figure 10:
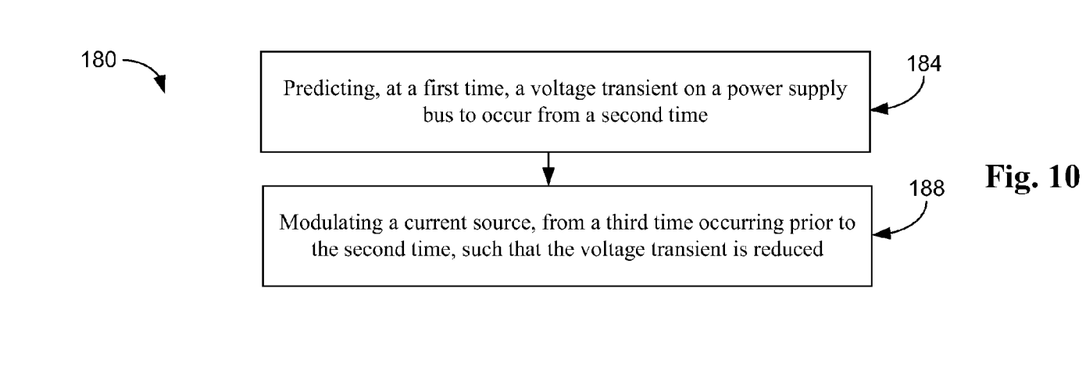
FIG. 10 illustrates an exemplary method for mitigating or reducing a voltage transient created in a power supply bus, in accordance with various embodiments.

FIG. 9 illustrates an exemplary timing diagram of a method for mitigating or reducing a voltage transient created in a power supply bus (e.g., power supply bus Vdd inside circuit 68A of FIG. 3), in accordance with various embodiments; and FIG. 10 illustrates an exemplary method 180 for mitigating or reducing such voltage transients, in accordance with various embodiments.

Referring to FIGS. 3, 9 and 10, method 180 includes, at 184, predicting, at a first time (e.g., time t0 of FIG. 9), a voltage transient on a power supply bus (e.g., power supply Vdd of FIG. 3) to occur from a second time (e.g., time t2 of FIG. 9). For example, in various embodiments, the current control logic 64 may be aware, at time t0, that at a future time t2, as a part of scan-based at-speed testing, short burst of clock signals may be applied to the circuit 68A, because of which load 94 may start drawing current from the power supply bus Vdd, causing a transient effect in the bus Vdd from time t2 (e.g., FIG. 6 illustrates such a transient).

In various embodiments, the method 180 may further include, at 188, modulating the current source 82A from a third time (e.g., t1) occurring prior to the second time t2, such that the voltage transient (to occur from t2) is reduced or substantially eliminated.

In various embodiments, the modulating at 188 may include turning on the current source 82A, at time t1, to draw a substantially constant current until time t2. That is, in various embodiments, the current source 82A may be configured (through the current control logic 64) to stop drawing current (or draw a reduced current) from the power supply bus Vdd at substantially the same time the bus Vdd is loaded by the load 94, which starts drawing current from the bus from time t2. Thus, the voltage transient caused by the increased load (e.g., caused by the start of the clock signals and subsequent loading of the load 94 at time t2) may be reduced or substantially eliminated by a corresponding reduction in load achieved through the reduction in current drawn by the current source 82A from time t2.

Thus, as illustrated in FIG. 9, in various embodiments, the current source 82A may be modulated such that the current may reach a first current level starting from time t1, and the current may reach a second current level starting from time t2, wherein the second current level may be substantially lower than the first current level. In various embodiments, the second current level may be substantially equal to zero.

The dotted line 192 in FIG. 9 (inside the dotted ellipse 190) represents the voltage transient that would have been caused due to the application of the clock signals at t2 (because of the increased loading of the bus Vdd), without any decrease in current drawn by the current source 82A. The solid line 194 represents the decreased voltage transient due to the reduction in current drawn by the current source 82A, along with the effects of the application of clock signals from time t2. Thus, lines 192 and 194 illustrate the reduction in voltage transient or the power supply droop caused by appropriately modulating the current source 82A, by reducing to zero (or a low value) the current drawn by the current source 82A at time t2.

In various embodiments, instead of a single current source 82A, a number of current sources, each coupled to the power supply bus Vdd and controlled by a single or a plurality of current control logic (e.g., as illustrated in FIG. 4), may be used to create a customizable voltage transient. For example, calibrating of the number of current sources and the amount of current drawn from each source may further reduce, eliminate or customize the voltage transient caused at time t2.

Figure 11:
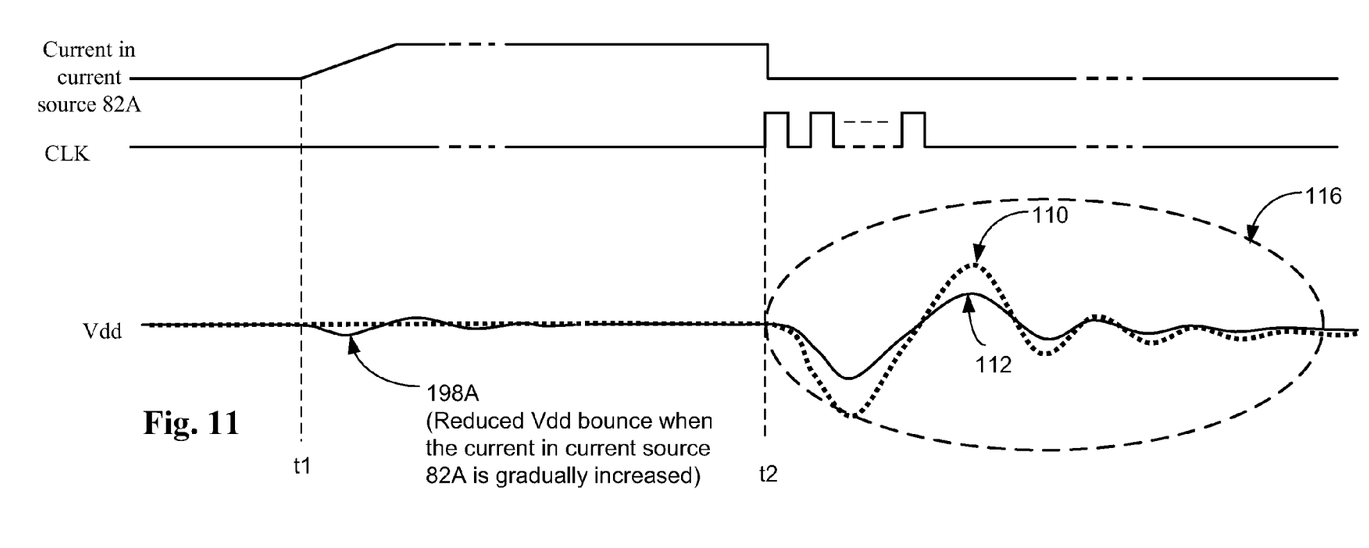
FIG. 11 illustrates another exemplary timing diagram of a method for mitigating or reducing a voltage transient created in a power supply bus, in accordance with various embodiments.

In various embodiments, because of the sudden increase in the current drawn by the current source 82A at time t1, there may be a transient in the power supply Vdd, represented by the solid line 198 inside the dotted circle 196 in FIG. 9. If there is sufficient time difference between t1 and t2 such that the voltage oscillation at time t1 is allowed to die down completely before the start of scan testing at t2, then the voltage transient 198 may not affect the testing results. Nonetheless, the voltage transient 198 may be reduced, for example, by gradually increasing the current in the current source 82A from time t1, as illustrated FIG. 11, and the reduced voltage transient is illustrated by the solid line 198A in FIG. 11. The gradual increase in the current of current source 82A in FIG. 11 may be achieved by appropriately configuring the queue entries 72a, 72b, . . . , 72N in the CLQ 72 of FIG. 2, wherein the queue entries may also be configured to further reduce or eliminate the voltage transient 198A.

Figure 12:
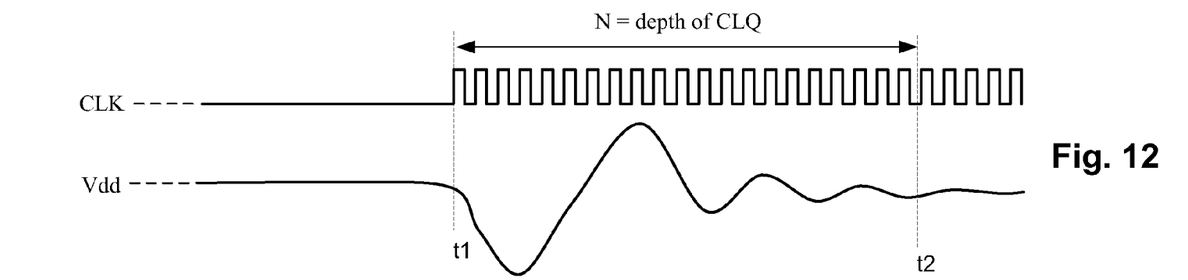
FIG. 12 illustrates another exemplary timing diagram of voltage transient created in a power supply bus, in accordance with various embodiments.

FIG. 12 illustrates another exemplary timing diagram of voltage transient created in a power supply bus (e.g., power supply bus Vdd inside circuit 68A of FIG. 3), in accordance with various embodiments. As illustrated in the figure, in various embodiments, the voltage transient may be created, from time t1, due to an application of a burst of clock signal to the circuit 68A of FIG. 3, as previously discussed herein (alternatively, in other embodiments, the transient may be created due to other reasons, as previously discussed herein), and the voltage transient may die or reduce below a threshold within time t2. The time required for the transient to die down (or reduce below a threshold) may be a function of a resonant frequency of one or more components of the circuit 68A and/or a resonant frequency of an integrated circuit in which the circuit 68A is included.

In various embodiments, it may be desired to modulate or control (e.g., increase, eliminate, and/or reduce) the voltage transient of FIG. 12 using one of the various embodiments discussed herein. In various embodiments, to effectively control the voltage transient of FIG. 12, the CLQ 72 of the current control logic 64 may need to be at least long enough to control current of the current source 68A (illustrated in, e.g., FIG. 3) from time t1 to time t2. Thus, in various embodiments, the CLQ 72 may need to be at least as deep as the number of clock cycles between time t1 and t2. Thus, if there are N number of clock cycles between t1 and t2, in various embodiments, the CLQ 72 may need to have at least N queue entries to effectively control the voltage transient.

For example, in various embodiments, if a circuit has a clock frequency of 1 GHz and a package resonant frequency of 100 MHz, it may take at least 10 clock cycles for a voltage transient to die down to zero (or below a certain threshold). Accordingly, a current control logic configured to control a voltage transient of the circuit may have at least 10 queue entries.

It should be apparent to those skilled in the art that in various other embodiments, the CLQ 72 may be shorter in length (i.e., with less than 10 queue entries) and may be required to loop back upon itself, as discussed previously in more details herein, and still effectively control the voltage transient.

In various embodiments, it may be desirable to implement more than one CLQ (either in one or separate current control logic, as discussed with respect to FIG. 4), each controlling a respective current source. For example, in various embodiments, a first CLQ, with an associated first current source, may create a resonant effect in a power grid of a circuit, which may be global in nature. That is, the first CLQ (a global queue) may control (i.e., create, increase, eliminate and/or reduce) a voltage transient throughout the circuit (or in a plurality of components in the circuit), possibly in a repeating manner. Thus, the current control logic may be configured to predict a voltage transient of periodic nature, and/or the global CLQ may be configured to create or control a periodic voltage transient based on the frequency of the package resonance. The repeating manner of the global CLQ may be achieved, for example, by repeating or looping back the queue entries of the global CLQ. In various embodiments, a global queue may control more than one current source to create a global transient in more than one component in the circuit.

In various embodiments, a second CLQ (e.g., a local CLQ), with an associated second current source, may be used to control a local voltage transient in one or more components of the circuit. In various embodiments, the local voltage transient may be a local affair (i.e., affect only a relatively small number of components in the circuit) and may not be periodic in nature (i.e., an instantaneous transient that is usually not repeated). As would be readily apparent to those skilled in the art, there may be more than one local CLQ, each controlling one or more components of a circuit.

In various embodiments, in an exemplary circuit, there may be a grid of 20×20 current source inducers 82A (i.e., 400 inducers) (not illustrated). A global CLQ may cause or control a global voltage transient (possibly in a periodic manner) in all the 400 inducers. In addition, a local CLQ may be used to create an instantaneous, non-periodic local voltage transient in, for example, the $400^{th}$ inducer only, thereby creating a local disturbance in that inducer's local power grid.

As would be readily apparent to those skilled in the art, different variations of global and local CLQs may be easily envisioned. For example, there may be plurality of CLQs, each controlling a respective area (including respective one or more components) of a circuit through respective one or more current source(s). In various embodiments, all the CLQs may be programmed to operate (or repeat, i.e., look-back, if periodicity is desired) in a substantially similar manner, thereby creating or controlling a voltage transient that is global in nature. In various embodiments, one or more of the plurality of CLQs may be programmed differently to create local effects in one or more components of the circuit.

Although certain example methods, apparatus, and articles of manufacture have been described herein, the scope of coverage of this disclosure is not limited thereto. On the contrary, this disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. A method comprising: predicting, by a current control logic, a voltage droop on a power supply bus; and modulating, by the current control logic, a current source, based at least in part on said predicting, to control the predicted droop; wherein said predicting comprises predicting, at a first time, that the voltage droop on the power supply bus is to occur from a second time; and wherein said modulating comprises modulating the current source from a third time that occurs prior to the second time.

2. The method of claim 1, where said modulating comprises:
modulating the current source to reduce the predicted voltage droop.

3. The method of claim 1, wherein said predicting further comprises:
predicting an increase in a current drawn by a load from said power supply bus from the second time; and
predicting the voltage droop on the power supply bus based at least in part on said predicting the increase in the current drawn from said power supply bus from the second time.

4. The method of claim 1, wherein said modulating further comprises:
modulating the current source, starting from the third time, to a first current level.

5. The method of claim 4, wherein said modulating further comprises:
modulating the current source, starting from the second time, to a second current level, wherein the second current level is less than the first current level.

6. The method of claim 5,
wherein said modulating the current source to the second current level further comprises decreasing the current of the current source from the first current level to the second current level; and
wherein the second current level is substantially equal to zero.

7. The method of claim 4, wherein said modulating further comprises:
modulating the current source, starting from the third time, to the first current level such that any voltage droop caused by modulating the current to the first current level is reduced below a threshold prior to the second time.

8. The method of claim 1, where said modulating comprises:
modulating the current source to increase the predicted voltage droop.

9. An apparatus comprising:
a current control logic configured to control a current source coupled to a power supply bus, the current control logic comprising:
a current level queue (CLQ) including a plurality of queue entries, if enabled, each queue entry configured to control the current source during a respective duration of time;
a default current level register, if enabled, configured to control the current source; and
a multiplexer to selectively enable either the current level queue or the default current level register and output a current level control signal configured to control a current level of the current source.

10. The apparatus of claim 9, further comprising:
a controller configured to predict a voltage transient in the power supply bus, to occur from a first time, caused at least in part by a change in a current of a load coupled to the power supply;
wherein the CLQ is configured to modulate the current source such that the voltage transient is reduced.

11. The apparatus of claim 10, wherein the CLQ is configured to increase a current supplied by the current source, from a second time that occurs prior to the first time, to a first current level.

12. The apparatus of claim 11, wherein the CLQ is further configured to decrease the current supplied by the current source, at the first time, from the first current level to a second current level.

13. The apparatus of claim 9,
wherein the load and the power supply are included in an integrated circuit.

14. The apparatus of claim 13, wherein a number of queue entries in the CLQ is based at least in part on a resonant frequency of the integrated circuit.

15. The apparatus of claim 9,
wherein the controller is further configured to predict a periodic nature of the voltage transient; and
wherein the CLQ is configured to periodically modulate the current source such that the voltage transient is reduced for each periodic occurrence.

16. A method for controlling a current source, comprising:
selectively enabling, by a current control logic, either a default current register or a current level queue (CLQ);
modulating the current source using the default current register, when enabled; and
modulating the current source using the CLQ, when enabled, the CLQ including a plurality of queue entries, each queue entry configured to modulate the current source for a respective duration of time.

17. The method of claim 16, wherein said modulating using the CLQ further comprises:
modulating the current source using the CLQ such that each queue entry is configured to modulate the current source for a respective clock cycle.

18. The method of claim 16, wherein said current source is coupled to a power supply bus, the method further comprising predicting a voltage droop in the power supply bus.

19. The method of claim 18, wherein said modulating the current source using the default current register and the CLQ further comprises:
modulating the current source using the default current register and the CLQ to control the voltage droop.

* * * * *